United States Patent
Lee

(10) Patent No.: US 7,939,226 B2
(45) Date of Patent: May 10, 2011

(54) BINARY MASK, METHOD FOR FABRICATING THE BINARY MASK, AND METHOD FOR FABRICATING FINE PATTERN OF SEMICONDUCTOR DEVICE USING BINARY MASK

(75) Inventor: Hye Mi Lee, Gwangju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 235 days.

(21) Appl. No.: 12/134,534

(22) Filed: Jun. 6, 2008

(65) Prior Publication Data

US 2009/0111035 A1    Apr. 30, 2009

(30) Foreign Application Priority Data

Oct. 31, 2007 (KR) .................. 10-2007-0110491

(51) Int. Cl.
*G03F 1/00* (2006.01)
*G03F 7/00* (2006.01)
(52) U.S. Cl. ............................ 430/5; 430/311; 430/313
(58) Field of Classification Search .............. 430/5, 22, 430/311–313, 322–324, 394; 355/67, 71; 438/424, 710
See application file for complete search history.

(56) References Cited

U.S. PATENT DOCUMENTS

| | | | | |
|---|---|---|---|---|
| 6,524,753 | B2 * | 2/2003 | Choi et al. | 430/5 |
| 6,828,080 | B2 * | 12/2004 | Nakao | 430/311 |
| 6,924,069 | B2 * | 8/2005 | Chen | 430/5 |
| 7,199,939 | B2 | 4/2007 | Ohkubo et al. | |
| 7,223,527 | B2 | 5/2007 | Tsai et al. | |
| 7,371,510 | B2 | 5/2008 | Hirayama et al. | |
| 2005/0019674 | A1 * | 1/2005 | Okubo et al. | 430/5 |
| 2007/0166650 | A1 * | 7/2007 | Wei | 430/311 |

FOREIGN PATENT DOCUMENTS

| | | |
|---|---|---|
| JP | 08-297357 | 11/1996 |
| KR | 10-2007-0052913 | 5/2007 |
| KR | 10-2007-0064011 | 6/2007 |
| KR | 10 2007 0068910 | 7/2007 |

* cited by examiner

*Primary Examiner* — Stephen Rosasco
*Assistant Examiner* — Stewart A Fraser
(74) *Attorney, Agent, or Firm* — Marshall, Gerstein & Borun LLP

(57) ABSTRACT

Provided are a binary mask, a method for fabricating the binary mask, and a method for fabricating a fine pattern of semiconductor device. In the method for fabricating the fine pattern, a binary mask including phase shift layer patterns is prepared on a transparent substrate. A semiconductor substrate including an etch objective layer and a resist layer is prepared. An exposure operation using the binary mask and a light source of a short wavelength is performed to transfer the phase shift layer patterns of the binary mask onto the resist layer of the semiconductor substrate. The resist layer to which the patterns have been transferred is developed to form resist layer patterns selectively exposing the etch objective layer. Exposed portions of the etch objective layer are etched using the resist layer patterns as an etch mask to form etch objective layer patterns. The resist layer patterns are removed.

2 Claims, 4 Drawing Sheets

BINARY MASK, METHOD FOR FABRICATING THE BINARY MASK, AND METHOD FOR FABRICATING FINE PATTERN OF SEMICONDUCTOR DEVICE USING BINARY MASK

CROSS-REFERENCE TO RELATED APPLICATIONS

The priority to Korean patent application number 10-2007-0110491, filed on Oct. 31, 2007, is hereby claimed and the disclosure thereof is incorporated herein by reference in its entirety.

BACKGROUND OF THE INVENTION

The present invention relates to a method for fabricating a semiconductor device and, more particularly, to a binary mask, a method for fabricating the binary mask, and a method for fabricating a fine pattern of a semiconductor device using the binary mask.

As a semiconductor device is more highly integrated, the size of a pattern realized in a semiconductor device reduces. Accordingly, the size of a pattern formed on a photomask also gradually reduces. Recently, a design rule for forming a fine pattern requires a critical dimension (CD) tolerance of approximately 2 nm. To overcome a resolution limitation, a photolithography process uses short wavelength light or uses an attenuated phase shift mask (PSM) controlling the phase of light through destructive interference alleviating an unnecessary diffraction effect.

Meanwhile, the attenuated PSM performs a CD correction process to meet a CD tolerance required for a fine pattern by a design rule. For the CD correction process, a phase shift layer and a light blocking layer are formed on a transparent substrate. Light blocking layer patterns are formed using resist layer patterns formed by a lithography process. The CD of the light blocking layer patterns is measured, the light blocking layer patterns are additionally etched to correct the CD of the light blocking layer patterns, and then exposed portions of the phase shift layer are etched using the corrected light blocking layer patterns as an etch mask to form phase shift layer patterns.

Generally, a PSM includes phase shift layer patterns having transmittance of approximately 6% with respect to short wavelength light. Recently, an ArF immersion lithography is performed to form a fine pattern of approximately 50 nm or less. Since a PSM in the ArF immersion lithography has a reduced resolution due to increased polarization effect and vector effect, a binary mask rather than the PSM is in current favor. However, the binary mask, including light blocking layer patterns still has a difficulty in meeting a CD error tolerance and CD uniformity required for forming a fine pattern. Also, to obtain a CD error tolerance and CD uniformity required during a process of fabricating the binary mask, a CD correction process applied to the binary mask should be additionally performed. In case of a binary mask including light blocking layer patterns, a hard mask material layer preventing a light blocking layer from being damaged by etching selectivity should be additionally deposited to perform the CD correction process. Accordingly, as the hard mask material layer is added, new processes related to a process condition and process equipment setting are required, and also, manufacturing cost and time for the mask increase.

SUMMARY OF THE INVENTION

Embodiments of the present invention are directed to a binary mask including a transparent substrate and phase shift layer patterns disposed on the transparent substrate and transmitting a portion of incident light having a long wavelength and blocking incident light having a short wavelength, the phase shift layer patterns including a layer material having transmittance of approximately 6% with respect to a long wavelength of approximately 248 nm.

In one embodiment, a method for fabricating a binary mask includes: forming a phase shift layer on a transparent substrate, the phase shift layer being configured (e.g. compositionally) to transmit a portion of incident light having a long wavelength and to block incident light having a short wavelength; forming hard mask layer patterns on the phase shift layer, the hard mask layer patterns being configured to selectively expose the phase shift layer; correcting a linewidth of the hard mask layer patterns; etching exposed portions of the phase shift layer using the corrected hard mask layer patterns as an etch mask to form phase shift layer patterns; and removing the corrected hard mask layer patterns. The phase shift layer may include a layer material having transmittance of approximately 6% with respect to a long wavelength of approximately 248 nm. The layer material may include a MoSiN layer having a thickness of approximately 930 Å. The hard mask layer patterns may include a Cr layer.

In another embodiment, a method for fabricating a fine pattern of a semiconductor device includes: preparing a binary mask, such as disclosed herein, including phase shift layer patterns disposed on a transparent substrate, the phase shift layer patterns being configured (e.g., compositionally) to transmit a portion of incident light having a long wavelength and to block incident light having a short wavelength; preparing a semiconductor substrate including an etch objective layer and a resist layer; transferring the phase shift layer patterns on the binary mask onto the resist layer of the semiconductor substrate by performing an exposure operation using the binary mask and a light source of a short wavelength; forming resist layer patterns selectively exposing the etch objective layer by developing the resist layer on which the phase shift layer patterns have been transferred; forming etch objective layer patterns by etching exposed portions of the etch objective layer using the resist layer patterns as an etch mask; and removing the resist layer patterns. The phase shift layer patterns may include a layer material having transmittance of approximately 6% with respect to a long wavelength of approximately 248 nm. The layer material may include a MoSiN layer having a thickness of approximately 930 Å.

DESCRIPTION OF SPECIFIC EMBODIMENTS

Hereinafter, a binary mask, a method for fabricating the binary mask, and a method for fabricating a fine pattern of a semiconductor device using the binary mask in accordance with the present invention will be described in detail with reference to the accompanying drawings.

Embodiment 1

Figure 1:
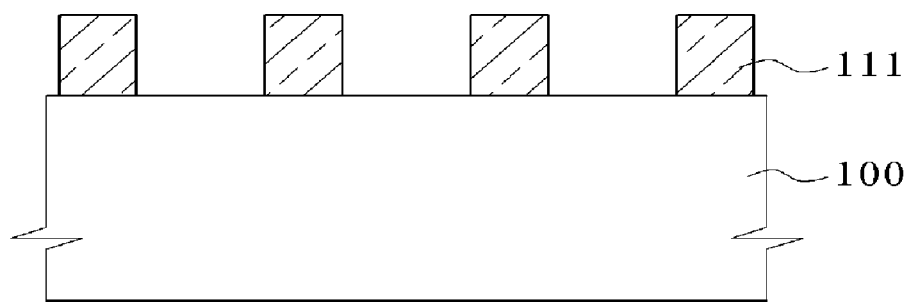
FIG. 1 illustrates a cross-sectional view of a binary mask according to the present invention.

Referring to FIG. 1, a binary mask according to the present invention includes a transparent substrate 100 and phase shift layer patterns 111 disposed on the transparent substrate 100. The phase shift layer patterns 111 transmit a portion of incident light having a long wavelength and block incident light having a short wavelength. In an embodiment, the phase shift layer patterns can include a layer material having transmittance of approximately 6% with respect to a long wavelength of 248 nm. For example, the phase shift layer patterns are a MoSiN layer having a thickness of approximately 930 Å. In case of transferring patterns on a semiconductor substrate using the phase shift layer patterns 111 having transmittance of approximately 6% with respect to a long wavelength, and light having a short wavelength cannot pass through portions where the phase shift layer patterns 111 have been formed, so the portions become light blocking regions, and exposed portions of the transparent substrate 100 between phase shift layer patterns 111 become light transmission regions. Consequently, when patterns are transferred on a semiconductor substrate using a binary mask having phase shift layer patterns providing transmittance of approximately 6% with respect to a long wavelength, and a light source of a short wavelength, the same effect can be obtained as in the case of a binary mask having light blocking layer patterns.

Embodiment 2

Figure 2:
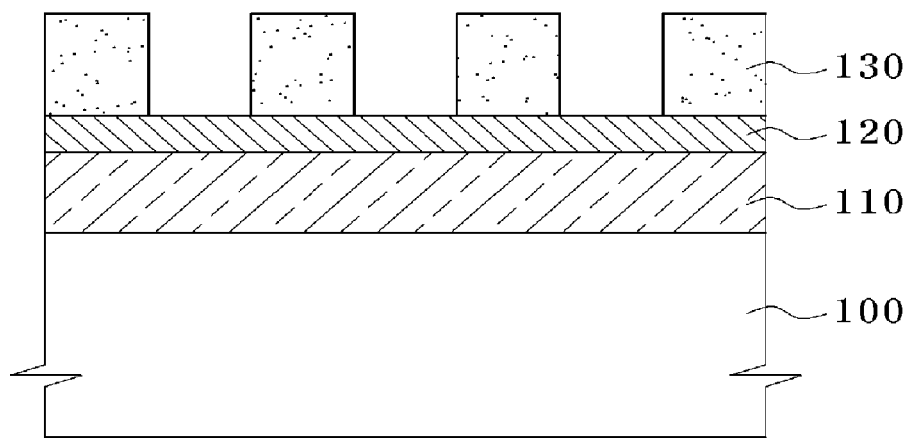
FIGS. 2 to 6 illustrate a method for fabricating a binary mask according to the present invention.

Referring to FIG. 2, in a method for fabricating a binary mask according to the present invention, a blank mask including a phase shift layer 110, a mask layer 120, and a resist layer 130 is manufactured. The phase shift layer 110 transmits a portion of incident light having a long wavelength and blocks incident light having a short wavelength. Specifically, a phase shift layer 110 transmitting a portion of incident light having a long wavelength and blocking incident light having a short wavelength, a mask layer 120, and a resist layer are formed on a transparent substrate 100 such as a quartz substrate. The phase shift layer 110 can be a layer material having transmittance of approximately 6% with respect to a long wavelength of 248 nm. For example, the phase shift layer 110 is a MoSiN layer having a thickness of approximately 930 Å. The phase shift layer 110 having the transmittance of approximately 6% with respect to the long wavelength is formed to have an approximately 1.36 times greater thickness than that of a phase shift layer having transmittance of approximately 6% with respect to a short wavelength. Generally, the long wavelength corresponds to a case where a KrF laser having a wavelength of 248 nm is used as a light source. The short wavelength corresponds to a case where an ArF laser having a wavelength of approximately 193 nm is used as a light source.

Since the wavelength of the KrF light source is approximately 1.28 times greater than that of the ArF light source. Therefore the phase shift layer patterns 111 having transmittance of approximately 6% with respect to a KrF light source should have an approximately 1.36 times greater thickness than the phase shift layer pattern having transmittance of approximately 6% with respect to a ArF light source.

The mask layer 120 can include a Cr layer but is not limited thereto. A lithography process is performed to form resist layer patterns 130 selectively exposing the mask layer 120. Specifically, an exposure process using a general electron beam can be performed on the resist layer. A developing process using a developer can be performed on the exposed resist layer. Then, electron beam-illuminated portions and electron beam non-illuminated portions are selectively developed by the developer, so that resist layer patterns 130 selectively exposing the mask layer 120 are formed.

Figure 3:
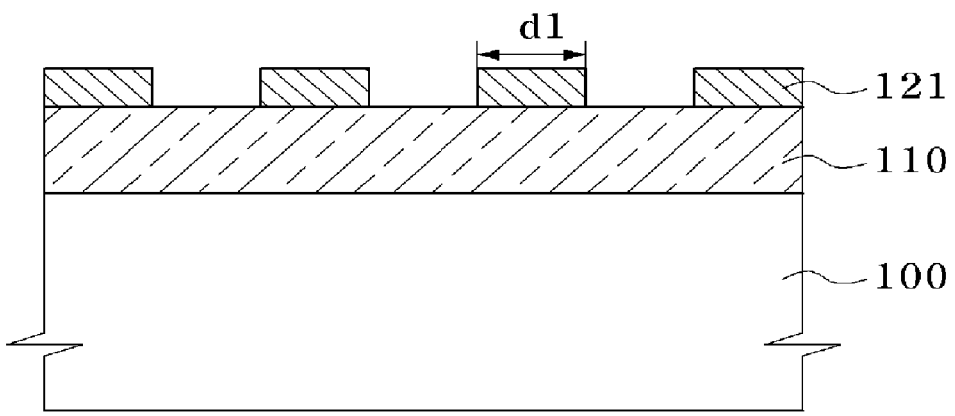

Referring to FIG. 3, the mask layer is etched according to the shape of the resist layer patterns 130 (of FIG. 2) to form mask layer patterns 121 selectively exposing the phase shift layer 110. The mask layer patterns 121 serve as an etch stop layer while the phase shift layer 110 is subsequently etched. Therefore, the linewidth of the phase shift layer patterns to be subsequently formed is determined by the linewidth d1 of the mask layer patterns 121. To obtain the exact linewidth of the phase shift layer patterns, the linewidth of the mask layer patterns 121 need to be exactly controlled, and the linewidth d1 of the mask layer patterns 121 is measured first. Also, the linewidth of the phase shift layer patterns to be subsequently formed is corrected on the basis of the measured linewidth d1 of the mask layer patterns 121. Accordingly, the CD of patterns required by a design rule for forming a fine pattern can be formed within CD error tolerance.

Figure 4:
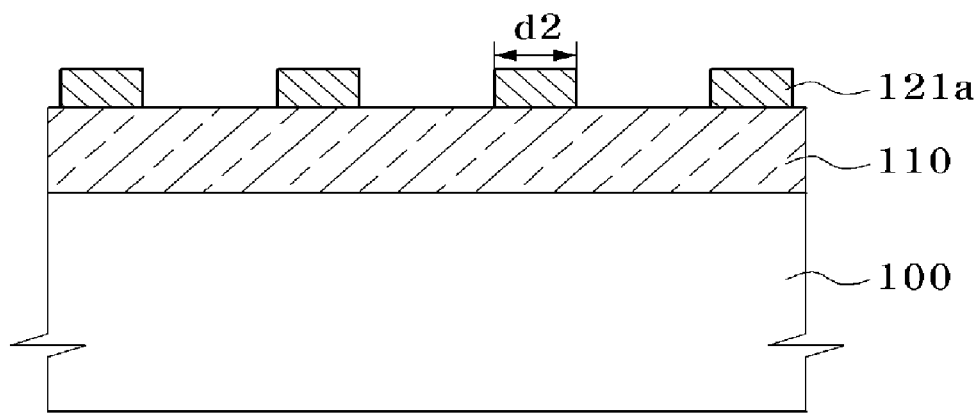

Referring to FIGS. 3 and 4, the CD d1 of the measured mask layer patterns 121 is compared with the CD of predetermined target patterns to calculate a correction value, and then the mask layer patterns 121 are additionally etched by the correction value. For example, the additional etching of the mask layer patterns (light blocking layer patterns) 121 is performed by controlling an etching time and a bias. The light blocking layer patterns 121 are additionally etched to coincide with the CD of the predetermined target patterns, so that the CD of the light blocking layer patterns 121 is corrected, resulting in the CD d2 of corrected mask layer patterns 121a.

Figure 5:
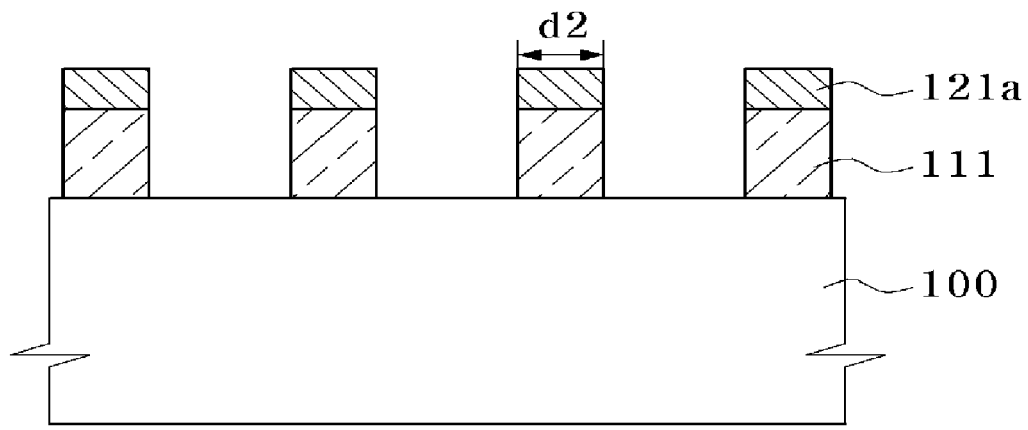

Referring to FIG. 5, exposed portions of the phase shift layer 110 are etched using corrected light blocking layer patterns 121a as an etch mask to form phase shift layer patterns 111. The phase shift layer 110 is etched to have the CD (d2) of the corrected light blocking layer patterns 121a. Therefore, the CD error tolerance of approximately 2 nm required by the design rule for forming the fine pattern can be met and uniformity in the linewidth can be improved. Also, since a correction process of a binary mask can be performed without a separate correction mask using the same operations as those in the PSM, the process time and costs can be reduced.

Generally, in case of a PSM including phase shift layer patterns having transmittance of approximately 6% with respect to a short wavelength, ArF immersion lithography is performed to form a fine pattern of 50 nm or less. Since a PSM generally formed in the ArF immersion lithography has a reduced resolution due to increased polarization effect and vector effect, a binary mask rather than a PSM is in current favor. However, a binary mask including light blocking layer patterns still has a difficulty in meeting a CD error tolerance and CD uniformity required for forming a fine pattern. In the binary mask including light blocking layer patterns, the light blocking layer patterns have a substantial influence on patterns of a subsequent wafer exposure process. Accordingly, when the light blocking layer patterns are damaged, they are transferred to subsequent wafer patterns to cause defects. Therefore, the binary mask including the light blocking layer patterns requires a separate correction mask correcting the light blocking layer patterns, new processes related to an increased number of processes and process setting are required. On the other hand, the present invention provides the phase shift layer transmitting a portion of incident light having a long wavelength and blocking incident light having a short wavelength on the transparent substrate, and corrects the linewidth of the mask layer patterns using the mask layer patterns including a Cr layer to form a binary mask including phase shift patterns having transmittance of approximately 6% with respect to a long wavelength. In case of mask layer patterns including a Cr layer, a width correction process is equivalently performed as in the correction process generally performed for the case of the conventional phase shift mask, and phase shift patterns can be formed using the corrected light blocking layer patterns. Also, since the light blocking layer patterns are removed after the phase shift layer patterns are formed, the phase shift layer patterns are not influenced even when a portion of the light blocking layer patterns is damaged during the correction process.

Figure 6:
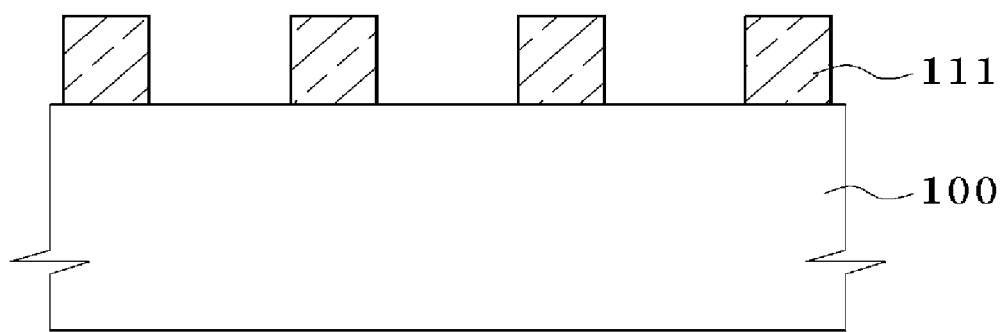

Referring to FIG. 6, the light blocking layer patterns are removed. Then, the binary mask having the phase shift layer patterns 111 providing the same effect as that of the light blocking layer patterns with respect to a short wavelength is manufactured. Accordingly, a binary mask that can meet a design rule requiring a fine pattern, for example, approximately 50 nm can be formed without a separate additional process can be fabricated.

Embodiment 3

Figure 7:
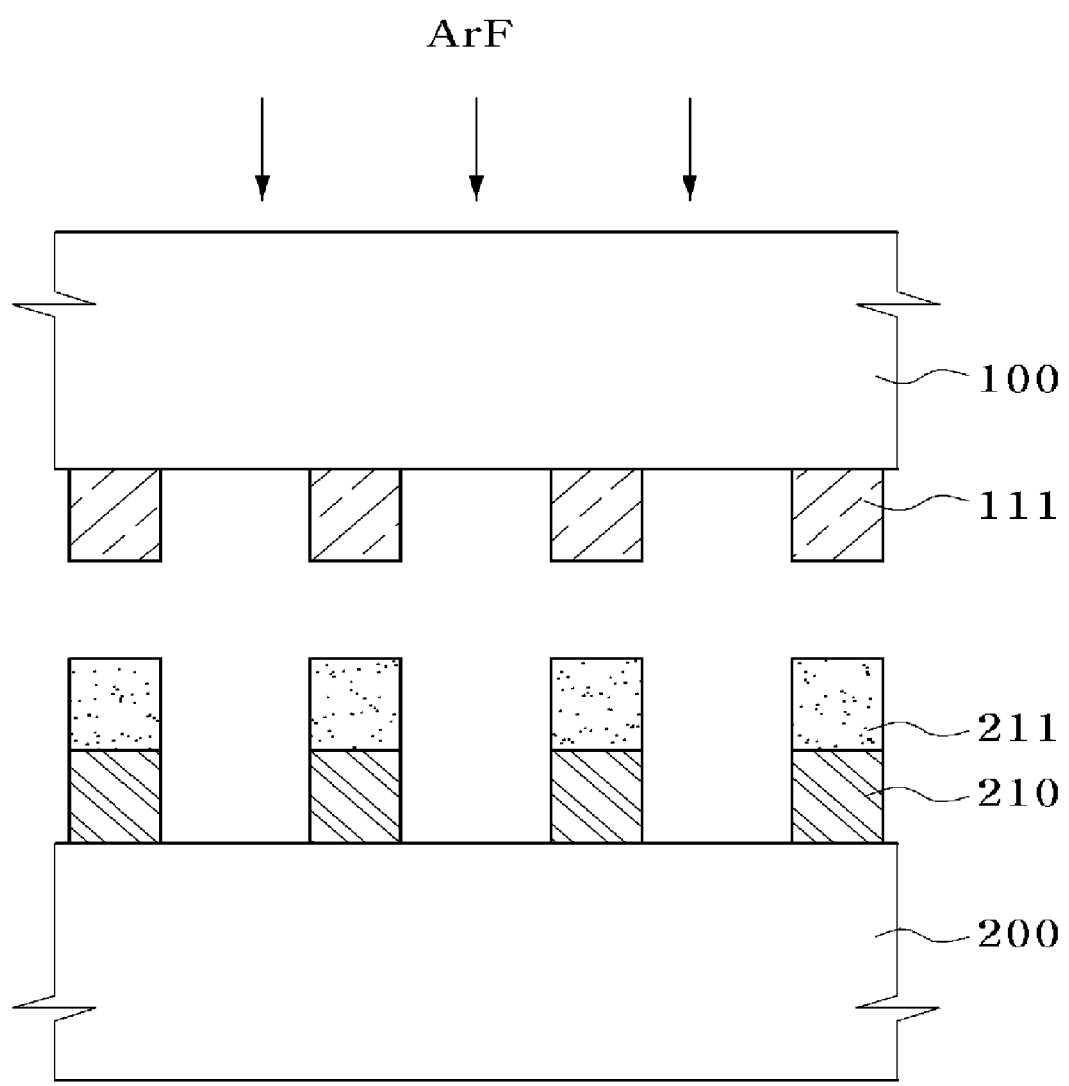
FIG. 7 illustrates a method for fabricating a fine pattern of a semiconductor device using a binary mask according to the present invention.

A method for fabricating fine patterns of a semiconductor device using a binary mask according to the present invention will be described with reference to FIG. 7. A transparent substrate 100 is disposed. A binary mask including phase shift layer patterns 111 transmitting a portion of incident light having a long wavelength and blocking incident light having a short wavelength is fabricated. At this point, the phase shift layer patterns 111 can include a layer material having transmittance of approximately 6% with respect to a long wavelength of 248 nm, for example, include a MoSiN layer having a thickness of approximately 930 Å. An immersion lithography process is performed on a semiconductor substrate 200 including an etch objective layer and a resist layer using the binary mask to form resist layer patterns 211 and etch objective layer patterns 210. Specifically, the etch objective layer and the resist layer are formed on the semiconductor substrate 200, the binary mask having the phase shift layer patterns 111 having transmittance of approximately 6% with respect to a long wavelength, and the semiconductor substrate 200 are aligned, and a light source of a short wavelength is illuminated onto the binary mask using an immersion lithography process equipment. An immersion lithography process can improve the resolution of an exposure process by using an immersion liquid, e.g., water having higher refractive index than that of air instead of an air gap on the surface of the semiconductor substrate.

For example, when the immersion lithography process equipment illuminates light having a short wavelength onto the phase shift layer patterns 111 having transmittance of approximately 6% with respect to a long wavelength, transmittance reduces and the light does not pass through the phase shift layer patterns 111. That is, portions where the phase shift layer patterns 111 have been formed become light blocking regions through which light having a short wavelength cannot pass, and exposed portions of the transparent substrate 100 between phase shift layer patterns 111 become light transmission regions through which light having a short wavelength can pass. Therefore, the binary mask having the phase shift layer patterns 111 providing transmittance of approximately 6% with respect to a long wavelength can obtain the same effect as that of the binary mask having light blocking patterns. Generally, the long wavelength corresponds to a case where a KrF laser having a wavelength of approximately 248 nm is used as a light source. The short wavelength corresponds to a case where an ArF laser having a wavelength of approximately 193 nm is used as a light source. Since the wavelength of the KrF light source is approximately 1.28 times greater than that of the Arf light source. Therefore the phase shift layer patterns 111 having transmittance of approximately 6% with respect to a KrF light source should have an approximately 1.36 times greater thickness than the phase shift layer pattern having transmittance of approximately 6% with respect to a ArF light source.

After an exposure process is performed through the immersion lithography process using a light source having a short wavelength, a developing process is performed to form resist layer patterns 211. The exposed portions of the etch objective layer are etched using the resist layer patterns 211 as an etch mask to form etch objective layer patterns 210, and then the resist layer patterns 211 are removed. Then, the fine-sized etch objective layer patterns 210 are formed on the semiconductor substrate 200. As described above, the immersion lithography process is performed using a light source of short wavelength, and the binary mask having the phase shift layer patterns 111 provides transmittance of approximately 6% with respect to a long wavelength, so that the resolution of the patterns formed on the semiconductor substrate is improved and thus fine patterns can be formed.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for fabricating a fine pattern of a semiconductor device, the method comprising:
   preparing a binary mask including a MoSiN layer disposed on a transparent substrate,
   wherein the MoSiN layer directly contacts the transparent substrate and has a thickness of approximately 930 Å in which the MoSiN layer blocks incident light from an ArF light source; and
   transferring patterns from the MoSiN layer to a wafer by performing a lithography process using the binary mask and the ArF light source.

2. The method of claim 1, wherein the performing of the exposure operation using the light source of a short wavelength comprised performing an immersion lithography process.

* * * * *